United States Patent [19]

Heinen et al.

[11] Patent Number: 4,747,649
[45] Date of Patent: May 31, 1988

[54] MONOLITHICALLY INTEGRATED WDM DEMULTIPLEX MODULE AND METHOD OF MANUFACTURE OF SUCH MODULE

[75] Inventors: Jochen Heinen, Haar; Hans F. Mahlein, Unterhaching; Reinhard März; Manfred Plihal, both of Munich; Heinrich Schlötterer; Gerhard Winzer, both of Putzbrunn; Ulrich Wolff, Munich, all of Fed. Rep. of Germany

[73] Assignee: Siemens Aktiengesellschaft, Berlin & Munich, Fed. Rep. of Germany

[21] Appl. No.: 813,954

[22] Filed: Dec. 27, 1985

[30] Foreign Application Priority Data

Jul. 7, 1985 [DE] Fed. Rep. of Germany ....... 3500206

[51] Int. Cl.$^4$ .............................. G02B 6/10
[52] U.S. Cl. .................. 350/96.12; 350/96.15; 350/96.19
[58] Field of Search ............... 350/96.11, 96.12, 96.13, 350/96.14, 96.15, 96.34, 96.16, 96.19; 357/17, 19, 30, 72, 74; 250/227

[56] References Cited

U.S. PATENT DOCUMENTS

| 3,978,426 | 8/1976 | Logan et al. | 350/96.11 |
|---|---|---|---|
| 4,136,928 | 1/1979 | Logan et al. | 350/96.11 |
| 4,273,445 | 6/1981 | Thompson et al. | 350/96.11 |
| 4,279,464 | 7/1981 | Colombini | 350/96.19 |
| 4,327,962 | 5/1982 | Redman | 350/96.15 |
| 4,523,212 | 6/1985 | Hawrylo | 357/17 |
| 4,531,809 | 7/1985 | Carter et al. | 350/96.19 |
| 4,608,749 | 9/1986 | Harada et al. | 357/30 |
| 4,626,878 | 12/1986 | Kuwano et al. | 357/19 |
| 4,640,574 | 2/1987 | Unger | 350/96.11 |

FOREIGN PATENT DOCUMENTS

| 132105 | 8/1982 | Japan | 350/96.12 |
|---|---|---|---|
| 149077 | 8/1984 | Japan | 350/96.11 |
| 6906 | 1/1985 | Japan | 350/96.11 |
| 32029 | 2/1985 | Japan | 350/96.11 |

OTHER PUBLICATIONS

Suhara et al., "Monolithic Integrated Microratings and Photodiodes for Wavelength Multiplexing", Appl. Phys. Lett., vol. 40, No. 2, Jan. 15, 1982, pp. 120-122.

Primary Examiner—William L. Sikes
Assistant Examiner—Frank González
Attorney, Agent, or Firm—Hill, Van Santen, Steadman & Simpson

[57] ABSTRACT

A monolithically integrated WDM demultiplex module has a film wave guide of InGaAsP fashioned on a substrate, a photodiode of InGaAs being applied to the film wave guide. The photodiode is optically coupled to the film wave guide by a leakage coupling. A wavelength selection element in the form of a grating is provided in the surface of the film wave guide. The module can be manufactured with a single epitaxial step. Structures for increasing the crosstalk attenuation of the module and for a better coupling-in of radiation into the module are provided.

18 Claims, 3 Drawing Sheets

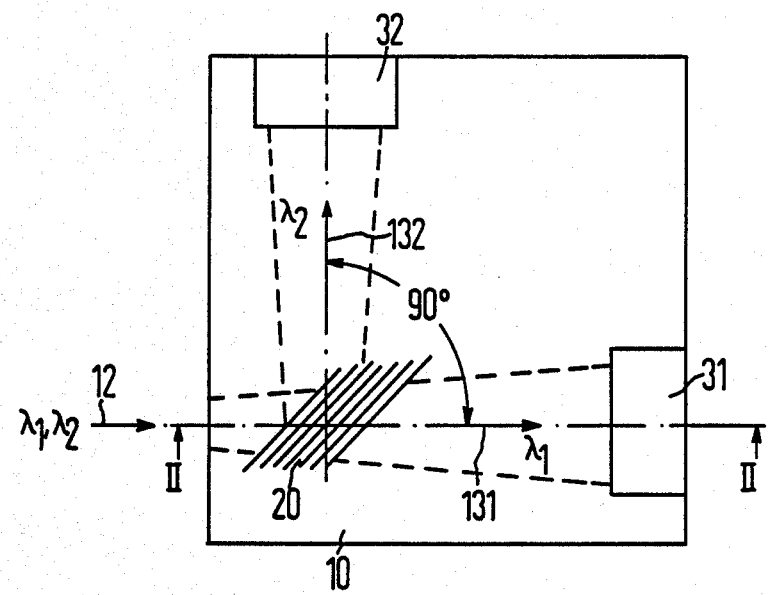
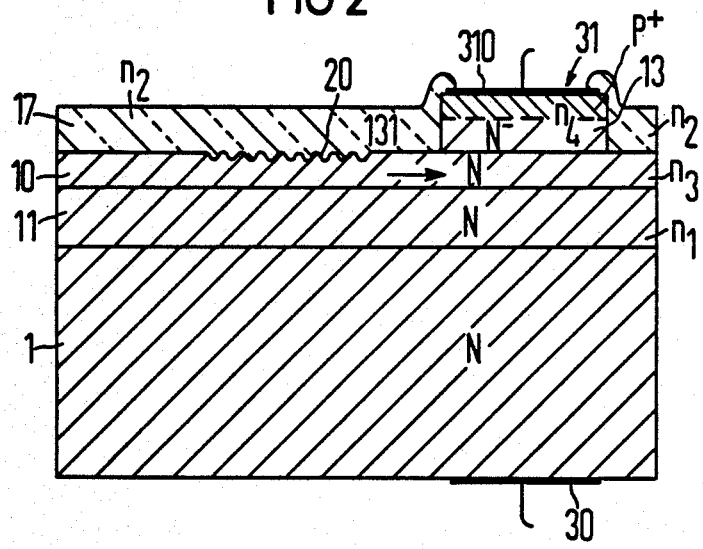

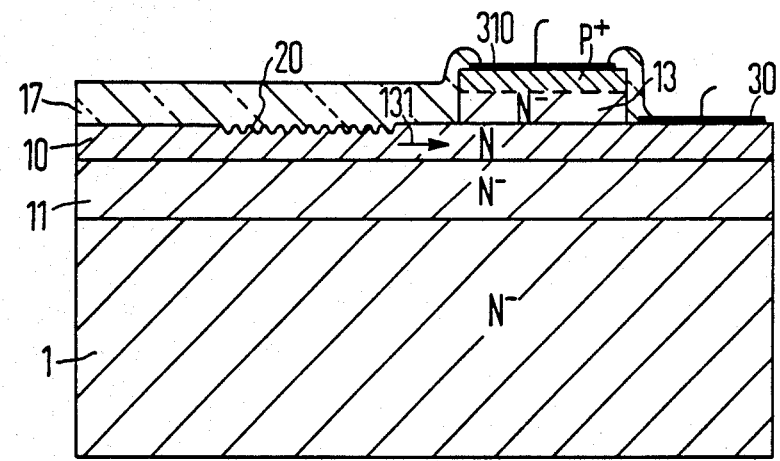
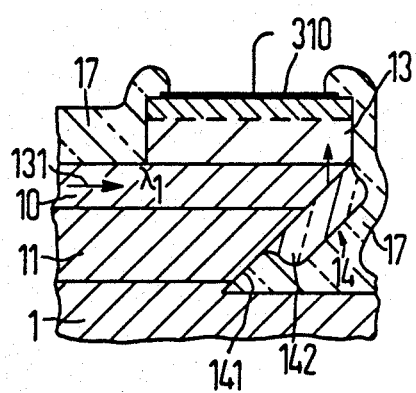
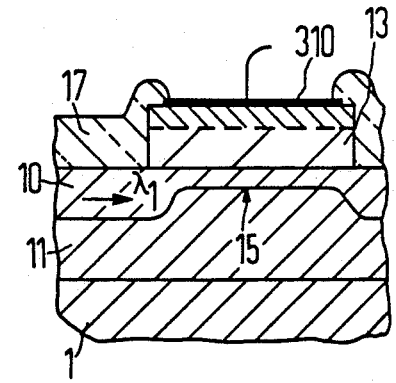

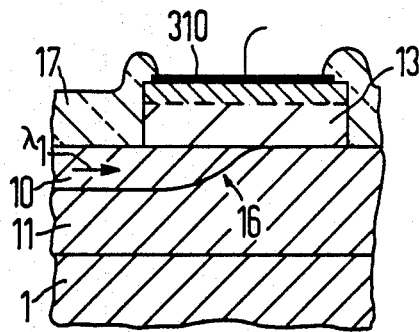
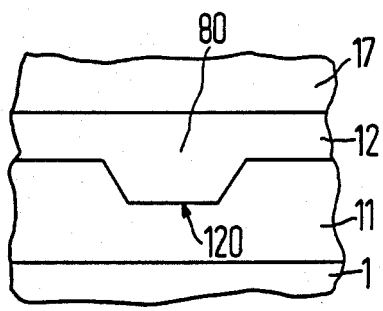
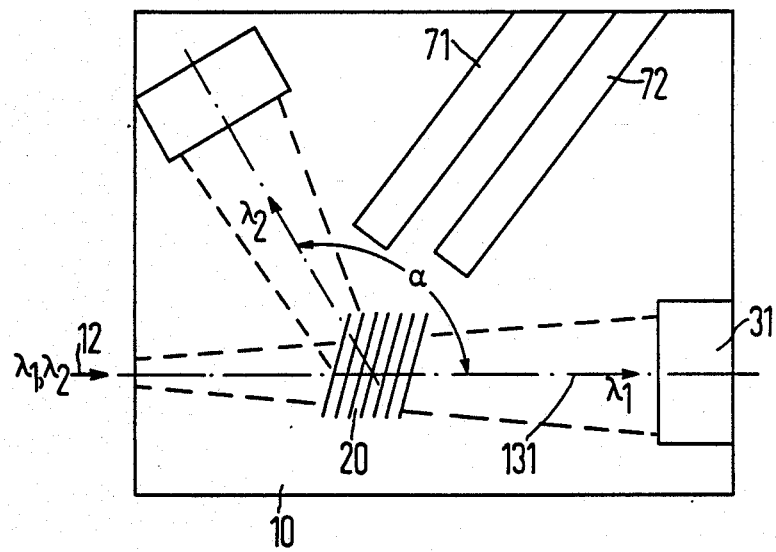

MONOLITHICALLY INTEGRATED WDM DEMULTIPLEX MODULE AND METHOD OF MANUFACTURE OF SUCH MODULE

BACKGROUND OF THE INVENTION

1. Field of the Invention

The present invention relates to a monolithically integrated WDM demultiplex module in which a film wave guide is provided for guiding a light beam containing a plurality of wave lengths, a wave length selection element is provided for splitting the light beam and propagating in a defined direction the radiation components containing mutually different wave lengths and propagating in various directions, and a plurality of photodetectors are optically coupled to the film wave guide and respectively receive the individual radiation components containing mutually different wave lengths. 2. Description of the Prior Art A module of the type set forth and a method for its manufacture are known in the art, for example, from the "Applied Physics Letters", Vol. 40, No. 2, Jan. 15, 1982, pp. 120–122. In this known module, the substrate is composed of silicon and the film wave guide is composed of $As_2S_3$. A buffer layer $SiO_2$ is located between the film wave guide and the substrate. The wave length selection element is composed of a grating introduced into the surface of the light wave guide, whose grooves extend obliquely relative to the propagation direction of the radiation propagating in the film wave guide. The radiation components propagating in various directions in the film wave guide following a grating and containing mutually different wave lengths are supplied to different photodetectors in the form of photodiodes. In this manner, each of the radiation components to which a separate wave length is assigned defines a wave length channel and a separate photodetector is assigned to each of these channels.

The manufacture of the above module occurs such that the buffer layer is first thermally generated on the surface of the silicon substrate and the film wave guide is then generated by vapor deposition in a vaccum. The photo diodes are fashioned in the form of Schottky diodes. The wavelength selection grating is written into the surface of the film wave guide by an electron beam.

SUMMARY OF THE INVENTION

The present invention aims at a cost-effective and highly reproducible manufacture of monolithically integrated WDM demultiplex modules having good demultiplex properties.

Proceeding from the module of the type initially set forth, the above is achieved in a WDM demultiplex module in which the wave guide, the wavelength selection element and the photodetectors are fashioned on the common substrate, and is particularly characterized in that the substrate is composed of InP and the film wave guide is composed of a quaternary layer.

According to a particular feature of the invention, the quaternary layer is composed of InGaAsP.

According to another feature of the invention, the photodetector is advantageously optically coupled to the film wave guide by leakage wave coupling.

The demultiplex module can be manufactured, according to the present invention, in a particularly simple manner when the photodetector is optically coupled to the film wave guide by leakage wave coupling and comprises a pn junction in one or more ternary layers directly applied to the film waveguide. Such modules can be manufactured with only one epitaxial step, i.e. in a uniform epitaxial process in which one or more layers are grown in immediate succession.

According to another feature of the invention, a ternary layer is preferably composed of InGaAs, particularly when the quaternary layer is composed of InGaAsP as set forth above.

Given a module of the present invention, in which the photodetector is optically coupled by leakage wave coupling and comprises a pn junction in one or more ternary layers directly applied to the waveguide and a ternary layer is composed of InGaAs when the quaternary layer is composed of InGaAsP, the leakage wave coupling can be improved in a simple manner in that, given the photodetector optically coupled to the film wave guide by leakage wave coupling, a reflecting element extends transversely relative to the film wave guide and is located obliquely relative to the propagation direction of the radiation component received by the photodetector, the reflective element reflecting the radiation passing by the photodetector in the direction of the photodetector, and in that the film wave guide comprises a taper in the region of the photodetector.

The radiation component supplied to a photodetector can contain channel-external and, therefore, unwanted wavelengths. Given a module of the type immediately set forth above, the influence of such a unwanted wavelength can be reduced in a simple manner in that the reflecting element comprises a filter for filtering out the unwanted wavelength.

A module constructed in accordance with the present invention is advantageously covered with a cover layer composed of $Si_3N_4$, polyimide or InP, particularly given the module set forth above.

Given a monolithically integrated module of the type initially set forth and, therefore, given an improved module constructed in accordance with the present invention and set forth above, crosstalk occurs, this being optically conditioned in part and electrically conditioned in part. Given a module of the initially mentioned type, and, in particular, given an improved module constructed in accordance with the present invention, this cross talk can be attenuated in a simple manner in that, according to a further feature of the invention, the wavelength selection element is constructed such that the various directions in which two neighboring, split radiation components propagate in the film wave guide describe an angle which is greater than 90° and/or in that a furrow and/or a grounding contact is provided between neighboring radiation components and photodetectors. The greater angle between neighboring radiation components leads to the fact that these radiation components have little mutual influence on one another and that the photodetectors are located at a greater spacing from one another and, as a result thereof, likewise have little mutual influence on one another. A furrow between neighboring radiation components and a grounding contact between neighboring photodetectors acts accordingly. Realizing all of the aforementioned measures simultaneously is most favorable for a high crosstalk attenuation.

The wavelength selection element, which is fashioned such that the various directions in which two neighboring, split radiation components propagate in the film wave guide describe an angle greater than 90°, can be made in a simple manner in that this element, according to another feature of the invention, is composed of a grating whose furrows extend steeper than 45° to the specific direction in which the radiation incident on the grating propagates.

A better coupling-in into a monolithically integrated demultiplex module of the type set forth initially and, particularly, into a module improved by practicing the present invention, can be achieved in a simple manner in that, according to a further feature of the invention, the film-wave guide comprises a thickening which defines a strip wave guide by way of which radiation can be coupled into the film wave guide. The radiation to be coupled-in is usually the radiation emerging from a fiber, particularly from a monomode fiber. In the region of the thickening, the film wave guide is better matched to the fiber cross-section, whereby the coupling-in is improved.

According to another feature of the invention, the thickening of the film wave guide is advantageously constructed as a buried strip wave guide extending parallel to the film wave guide, the buried strip wave guide extending into the substrate.

A module can be constructed in accordance with the above, features, particularly one in which the photodetector is optically coupled to the film wave guide by leakage wave coupling and comprises a pn junction in one or more ternary layers, the ternary layer or layers preferably composed of InGaAs, particularly when the quaternary layer is composed of InGaAsP, in that a layer sequence is generated on the substrate in a single epitaxial step, at least one ternary layer immediately following the quaternary layer provided for the film wave guide in the layer sequence, in that the quaternary layer is etched down and outside of the region provided for a photodetector, and in that the wavelength selection element is then formed on the exposed region of the quaternary layer and the photodetector is generated on the remaining ternary layer.

BRIEF DESCRIPTION OF THE DRAWINGS

Other objects, features and advantages of the invention, its organization, construction and operation will be best understood from the following detailed description, taken in conjunction with the accompanying drawings, on which:

FIG. 1 is a schematically illustrated plan view of a monolithically integrated wavelength demultiplexing module (WDM);

FIG. 2 is a sectional view along the line II—II of FIG. 1;

FIG. 3 is a sectional view of a modified embodiment of the module of FIG. 1, shown in the same general section as that of FIG. 2;

FIG. 4 is a fragmentary sectional view according to FIG. 2 which illustrates the embodiment of a reflecting element at a photodetector;

FIGS. 5 and 6 are fragmentary sectional views, generally in accordance with FIG. 4, which, instead of illustrating a reflecting element at the photodetector, illustrate various embodiments of tapers of the film wave guide in the region of the photodetector;

FIG. 7 is a plan view, according to FIG. 1, of a modified embodiment of a module in which measures are provided for increasing the crosstalk attenuation; and FIG. 8 is a fragmentary end view of a module which illustrates a thickening of the film waveguide, whereby the end view corresponds to a plan view in the direction of the arrow 12 at the left-hand side of the module of FIG. 1.

DESCRIPTION OF THE PREFERRED EMBODIMENTS

In FIG. 1, a monomode film wave guide 10 comprises InGaAsP in which a one-dimensional Gaussian beam can propagate. A planar grating 20 is fashioned in the film wave guide, the grating 20 being provided, for example, by writing with an electron beam.

The grating 20 is dimensioned and located such that a radiation containing two wavelengths $\lambda_1$ and $\lambda_2$ which, for example, are coupled in from a monomode fiber in the direction of the arrow 12, being coupled into the film wave guide 10 and propagating therein essentially in the direction 12, is split into two radiation components at the grating 20, of which the one radiation component contains essentially the wavelength $\lambda_1$ and the other only essentially contains the other wavelength $\lambda_2$, and which components propagate in different directions 131 or, respectively, 132 in the film wave guide 10. It is assumed in FIG. 1 that the two directions 131 and 132 describe an angle of 90° and that the direction 131 corresponds to the defined direction 12.

A pair of photodetectors 31 and 32 are applied to the film wave guide 10, the photodetector 31 receiving the radiation component containing the wavelength $\lambda_1$ and the photodetector 32 receiving the radiation component containing the wavelength $\lambda_2$. The two photodetectors 31 and 32 are composed of photodiodes which are coupled to the film wave guide 10 by leakage wave coupling.

Typical dimensions of the module of FIG. 1 are:

The length in the direction 12 and the width perpendicular to the direction 12 amounts to about 2 mm; and Given these dimensions, the longitudinal and transverse dimensions of the detectors are approximately 100 $\mu$m.

The internal structure of the module of FIG. 1 is shown in the sectional view of FIG. 2. A layer 11 is applied onto the substrate 1 of InP which is epitaxially grown and only serves the purpose of improving the surface of the substrate 1. The layer 11 is superfluous when the substrate 1 already exhibits satisfactory surface quality.

An $In_{4-x}Ga_xAs_yP_{4-y}$ layer is grown epitaxially on the layer 11, comprising the thickness of at most 2 $\mu$m and forming the film wave guide.

The substrate 1, the layer 11 and film wave guide 10 are n-doped and conductive.

The grating 20 is introduced into the surface of the layer 10, the furrows thereof extending obliquely to the plane of the drawing in a plane perpendicular to the plane of the drawing.

The photodiode 31 is realized by portion of an $In_{0.53}Ga_{0.47}As$ layer 13 which comprises a layer region adjacent to the layer 10 which is n−doped or self-conducting and at which a p+doped region is adjacent at that side facing away from the layer 10. A p contact 310 is applied to the layer 13, the cooperating contact thereof being applied to the opposite side of the substrate 1 as a n contact 30.

The layer thickness of the layer portion 13 amounts to 1–3 $\mu$m. The length of the layer portion 13 measured in the direction 131 typically amounts to 10–100 $\mu$m, whereas its width measured perpendicular to the direction 131 typically lies at 100 $\mu$m.

The layer portion 13 can be composed of a single, epitaxially-grown layer into which the p+doped region is introduced by diffusion; or it can be composed of an epitaxially-grown n⁻doped or self-conducting layer and of a p⁺doped layer epitaxially grown thereon.

All epitaxial layers can be grown by a liquid phase epitaxy.

The surface of the module is covered with a cover layer 17 which can be composed of $Si_3N_4$, polyimide or InP. These materials have a refractive index $n_2$ which, like the refractive index $n_1$ of InP, is lower than the refractive index $n_3$ of the layer 10 composed of InGaAsP. This is necessary so that the layer 10 can act as a film wave guide.

The layer portion 13 of InGaAs has a refractive index $n_4$ which is greater than the refractive index $n_3$. This is necessary for the realization of a leakage wave coupling.

The module of FIGS. 1 and 2 can be manufactured in a very simple manner with only a single epitaxial step. To this end, a layer sequence corresponding to the layers 11, 10 and 13 is first generated on the conductive substate in one epitaxial step. As already mentioned, the layer corresponding to the layer portion 13 can be composed of a single layer or of a double layer. This top, single layer or double layer is eroded down to the layer portion 13, for example by chemical etching. The grating 20 is written, for example, by an electron beam, into the exposed surface of the layer 10. After the application of the p contact 310, for example by vapor deposition, the cover layer 17 is applied. The contact 30 can be applied before the beginning, during or after conclusion of the process.

When the layer corresponding to the layer portion 13 is a single layer and the p⁺doped region is formed by diffusion, then the diffusion can be undertaken before or after the etching of this layer.

The modified embodiment of the module illustrated in FIG. 3 differs from the module of FIGS. 1 and 2 only in that the substrate 1 and the layer 11 are semi-insulating and, as a consequence thereof, the n contact 30 is not located at that side of the substrate 1 opposite the p contact 310 but, rather, is located at the same side as the p contact 310.

FIG. 4 illustrates a reflecting element 14 located at the layer portion 13 which reflects radiation passing by the layer portion 13 in the direction toward the layer portion 13. The realization of this reflecting element can occur such that a surface 141 is generated by wet chemical etching or by ion beam etching, the surface 141 extending transversely over the layer 10 and obliquely with respect to the direction 131. When it is located at the correct angle, the surface 141 can effect total reflection and then forms the reflecting element 14 which is then advantageously covered with a protective layer. A reflecting coating 142, for example a dielectric multiple layer, can also be applied to the surface 141. In is advantageous to employ a reflecting coating 142 which additionally comprises a filter effect such that it is transparent for a light component having an unwanted wavelength, which would be the wavelength $\lambda_2$ in the case of FIG. 4. This unwanted wavelength is then not reflected into the layer portion 13. Such a coating can likewise be realized by a multiple layer.

FIGS. 5 and 6 illustrate two realizations of tapers of the film wave guide 10 in the region of the layer portion 13. In the case of FIG. 5, the film wave guide 10 re-expands following the taper 15, while in the case of FIG. 6, however, it ends with the taper 16.

A modification of the module of FIG. 1 is shown in FIG. 7 which essentially differs therefrom only in that the furrows of the grating 20 proceed at a steeper angle than 45° relative to the direction 12, whereby it is effected that the directions 131 and 132 do not describe an angle of 90° but, rather, a larger angle $\alpha$. The detectors 31 and 32 are therefore situated farther from one another. The crosstalk attenuation is thereby increased. Further, a furrow 71 and a grounding contact 72 extend between the radiation components propagating in the directions 131 and 132 and the detectors 31 and 32. All of these measures contribute to increasing the crosstalk attenuation. Given a channel spacing of 10–20 nm and given a wavelength of 1.55 μm, a crosstalk attenuation of more than 20 decibels can be anticipated, related to the optical power. grating 20 having a grating length which supplies a peak reflection for the reflected wavelength λhd 2 which is greater than 0.99 is thereby assumed.

An improved coupling-in of the radiation emerging, for example, from a monomode fiber into the film wave guide 10 is achieved by a thickening 120 of the film wave guide 10 shown in a front view in FIG. 8 because the thickening 120 is better adapted to the cross-section of the fiber whose axis extends through the point 80 and perpendicular to the plane of the drawing. For example, the film wave guide can be twice as thick in the region of the thickening 120 as it is outside of this thickening. The coupling between the monomode fiber and the module adantageously occurs via a fiber taper.

Although we have described our invention by reference to a particular illustrative embodiment thereof, many changes and modifications of the invention may become apparent to those skilled in the art without departing from the spirit and scope of the invention. We therefore intend to include within the patent warranted hereon all such changes and modifications as may reasonably and properly be included within the scope of our contribution to the art.

We claim:

1. A monolithically integrated wavelength demultiplexing module, comprising:
    a film wave guide for guiding a light beam containing a plurality of wavelengths;
    a wavelength selecting element in said waveguide for splitting the light beam into the respective wavelength components and directing the components in different directions through the film waveguide;
    a plurality of photodetectors optically coupled to said film wave guide and respectively positioned to receive respective ones of said components;
    a common substrate carrying said wave guide, said wavelength selection element and said photodetectors, said substrate comprising InP;
    said film wave guide comprising a quaternary layer; and
    a reflective element extending transversely relative to said film wave guide and obliquely to the propagation direction of a radiation component to be received by a photodetector, said reflective element reflecting the radiation passing said photodetector in the direction toward said photo detector;

2. The monolithically integrated wavelength demultiplexing module of claim 1 wherein: said quaternary layer comprises InGaAsP.

3. The monolithically integrated wavelength demultiplexing module of claim 1, wherein:

said photodetectors are leakage wave coupled to said film wave guide.

4. The monolithically integrated wavelength demultiplexing module of claim 1, wherein:
said photodetectors are each leakage wave coupled to said film wave guide and comprises a doped ternary layer directly applied to said film wave guide.

5. The monolithically integrated wavelength demultiplexing module of claim 1, wherein:
said photodetectors are each leakage wave coupled to said film wave guide and comprise a plurality of ternary layers of different dopings directly applied to said film wave guide.

6. The monolithically integrated wavelength demultiplexing module of claim 4, wherein:
said ternary layer comprises InGaAs.

7. The monolithically integrated wavelength component of claim 1, wherein:
said film wave guide comprises a taper section of reduced thickness adjacent a photodetector.

8. The monolithically integrated wavelength demultiplexing module of claim 1, wherein:
said reflective element comprises a filter for filtering out a disturbing wavelength.

9. The monolithically integrated wavelength demultiplexing module of claim 1 and further comprising:
a cover layer covering said module.

10. The monolithically integrated WDM demultiplex module of claim 9, wherein:
said cover layer comprises $Si_3N_4$.

11. The monolithically integrated wavelength demultiplexing module of claim 9, wherein:
said cover layer comprises polyimide.

12. The monolithically integrated wavelength demultiplexing module of claim 9, wherein:
said cover layer comprises InP.

13. The monolithically integrated wavelength demultiplexing module of claim 1, wherein:
said film wave guide comprises a generally planar element and a strip extending through said substrate as a thickened portion of said wave guide.

14. A monolithically wavelength demultiplexing module, comprising:
a film wave guide for guiding the light beam containing a plurality of wavelengths;
a wavelength selecting element in said wave guide for splitting the light beam into the respective wavelength components and directing the components in different directions through the film waveguide;
a plurality of photodetectors optically coupled to said film wave guide and respectively positioned to receive respective ones of said components;
a common substrate carrying said waveguide, said wavelength selection element and said photodetectors, said substrate comprising InP; and
said film wave guide comprising a quaternary layer, and
said wavelength selecting element comprising means for splitting the light beam and propagating the components through said film wave guide along paths describing an angle of greater than 90° with respect to one another.

15. The monolithically integrated wavelength demultiplexing module of claim 14, wherein sid wavelength selecting element comprises:
a grating including furrows extending at an angle greater than 45° relative to the propagating direction of the incoming light beam.

16. A method of making a monolithically integrated WDM demultiplex module which comprises a film wave guide for guiding a light beam containing a plurality of components of different wavelengths, a wavelength selecting element for splitting the light beam and propagating the individual components with respect to the defined direction of radiation of the light beam through the film wave guide in respective directions, a plurality of photodetectors optically coupled to the film wave guide for respectively receiving the radiation components of the different wavelengths, and in which the wave guide, the wavelength selecting element and the photodetectors are carried on a common substrate comprising InP and the film waveguide is composed of a quaternary layer, the method comprising the step of:
applying the wavelength selecting element to the substrate so that the individual components propagate at a respective angle greater than 90° with respect to the direction of the light beam.

17. A method of making a monolithically integrated wavelength demultiplexing module which comprises a film wave guide for guiding a light beam containing a plurality of components of different wavelengths, a wavelength selecting element for splitting the light beam and propagating the individual components with respect to the defined direction of radiation of the light beam through the film wave guide in respective directions, a plurality of photodetectors optically coupled to the film wave guide for respectively receiving the radiation components of the different wavelengths, and in which the wave guide, the wavelength selecting element and the photodetectors are carried on a common substrate comprising InP and the film waveguide is composed of a quaternary layer, the method comprising the step of:
applying a grounding contact to the light wave guide extending between neighboring radiation components and their respective photodetectors.

18. A method of making a monolithically integrated wavelength demultiplexing which comprises a film wave guide for guiding a light beam containing a plurality of components of different wavelenths, a wavelength selecting element for splitting the light beam and propagating the individual components with respect to the defined direction of radiation of the light beam through the film wave guide in respective directions, a plurality of photodetectors optically coupled to the film wave guide for respectively receiving the radiation components of the different wavelengths, and in which the wave guide, the wavelength selecting element and the photodetectors are carried on a common substrate comprising InP and the film waveguide is composed of a quaternary layer, the method comprising the steps of:
forming on the substrate in a single epitaxial step a quaternary layer for the film wave guide and at least one ternary layer thereon;
etching the ternary layer down to the quaternary layer outside of a predetermined region provided for a photodetector;
forming the wavelength selecting element on the exposed region of the quaternary layer; and
forming the photodetector on the remaining ternary layer.

* * * * *